United States Patent [19]

Sleight

[11] 3,932,315
[45] Jan. 13, 1976

[54] SUPERCONDUCTIVE BARIUM-LEAD-BISMUTH OXIDES
[75] Inventor: Arthur W. Sleight, Wilmington, Del.
[73] Assignee: E. I. Du Pont de Nemours & Company, Wilmington, Del.
[22] Filed: Sept. 24, 1974
[21] Appl. No.: 508,887

[52] U.S. Cl. ............................... 252/521; 252/518
[51] Int. Cl.² ...................... H01B 1/06; H01C 8/00
[58] Field of Search ........................... 252/521, 518

[56] References Cited
UNITED STATES PATENTS

| | | | |
|---|---|---|---|
| 3,374,185 | 3/1968 | Nitta | 252/521 |
| 3,682,841 | 8/1972 | Matsuoka | 252/521 |
| 3,775,347 | 11/1973 | Bouchard | 252/518 |

OTHER PUBLICATIONS

Shannon, Journal of the American Ceramic Society, Vol. 53, No. 11, Nov. 1970, pp. 635–636.

Scholder, Zeitschrift fur Anorganische und Allgemeine Chemie, Band 319, (1963), pp. 375–386.

*Primary Examiner*—Benjamin R. Padgett
*Assistant Examiner*—Donald P. Walsh

[57] ABSTRACT

Compositions of the formula
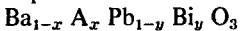
$$Ba_{1-x} A_x Pb_{1-y} Bi_y O_3$$
where
A is Na, K, Rb, Cs, Sr or Pb,
$x$ is 0 to about 0.5,
$y$ is about 0.05–0.3, with the proviso that $x \leq y$ when A is Na, K, Rb or Cs
are superconductors.

5 Claims, No Drawings

SUPERCONDUCTIVE BARIUM-LEAD-BISMUTH OXIDES

BACKGROUND OF THE INVENTION

1. Field of the Invention

This invention relates to novel superconductors, and more particularly to solid compositions which are oxides of barium, lead and bismuth.

2. Background of the Invention

Superconducting oxide compounds are rare. In most structures the presence of oxygen is detrimental to superconductivity. The only oxide with a superconducting state above 7K is reported to be a spinel structure having a composition near $LiTi_2O_4$ (Johnston et al., Mat. Res. Bull. 8, p. 777–784 (1973)).

The compound $BaPbO_3$ is described by Shannon and Bierstedt in Jour. Am. Ceram. Soc., vol. 53, p. 635–636 (1970). Metallic conduction is shown with a room temperature resistivity of about 300 micro ohm cm. which extrapolates to about $90 \times 10^{-6}$ ohm cm. at OK. A diffraction pattern is given which is interpreted as a perovskite structure with orthorhombic distortion.

The compound $BaBiO_3$ is described by Scholder et al., Z. anorg. allgem. Chemie, 319, 375–386 (1963) as having an ordered perovskite structure. No properties are given.

SUMMARY OF THE INVENTION

It has now been discovered that solid solutions can be formed between the two types of perovskite structures $BaPbO_3$ and $BaBiO_3$, and that for a certain restricted range of this series the compositions have superconducting properties which are maintained at unusually high temperatures. These superconductive compositions are of the formula

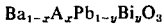
$Ba_{1-x}A_xPb_{1-y}Bi_yO_3$ where

A is Na, K, Rb, Cs, Sr or Pb, $x$ is 0 to about 0.5, $y$ is about 0.5–0.3, with the proviso that $x \leq y$ when A is Na, K, Rb or Cs.

DESCRIPTION OF THE INVENTION

The compositions of this invention contain lead and bismuth in high formal valence states. Accordingly, they are quite stable in oxidizing environments. In contrast to the few superconducting oxides known heretofore which contain elements in reduced oxidation states, these compositions make it possible to fabricate superconductive arrays by conventional sintering procedures.

The compositions of this invention all crystallize in a structure related to that of the mineral perovskite, $CaTiO_3$, which is the prototype of a large class of perovskite-type compositions. While the perovskite-type structure is ideally cubic, small distortions from cubic symmetry are common, as are superstructure variants in which a larger unit cell extended by a simple multiple in one or more dimensions is needed to account for some ordering of the cations among particular sites. The novel perovskite-type compositions of this invention behave similarly and like the well-known variants still yield characteristic x-ray patterns which are easily recognized as being of the perovskite-type. The powder diffraction pattern reported for $BaPbO_3$ serves as a particularly good prototype for the compositions of this invention.

Many oxides of perovskite-type structure are known to have minor departures in stoichiometry from the ideal formula $ABO_3$. Thus, slight oxygen deficiencies up to about 5% are quite common and may be expected to pertain as well in some of these new compositions. Such minor oxygen loss would be easily compensated by a lower valence for a small proportion of the $Pb^{+4}$ or $Bi^{+5}$ occupying the $Ti^{+4}$ sites of the prototype $CaTiO_3$ perovskite. It will also be appreciated that minor amounts of lead could exist as $Pb^{+2}$ and by virtue of similar size and chemical nature to $Ba^{+2}$ might thus occupy a few of the prototype's $Ca^{+2}$ sites.

The accuracy of the stoichiometry $Ba_{1-x}A_x$-$Pb_{1-y}Bi_yO_3$ will be understood in the light of the foregoing considerations. Departures from this formulation will be minor, often within the accuracy limits of many conventional analytical methods, and their essential character will be confirmed by the perovskite-type diffraction patterns. Accordingly, minor deviations from the above stoichiometry are considered to be within the scope of the above structure provided the composition exhibits a perovskite-type diffraction pattern.

The compositions of this invention may be prepared by direct combination of the metal oxides or their precursors by heating at temperatures of about 600°–1000°C., and preferably about 800°–1000°C. The use of oxide precursors such as the nitrates or carbonates is preferred for convenience and to avoid contamination that may accompany the use of caustic oxides such as $BaO$ and $Na_2O$. Any inert container may be used; gold vessels are particularly useful to avoid contamination. The reactants should be intimately mixed before heating. Regrinding at one or more intermediate stages of the complete heating cycle may be desirable to facilitate the solid state reaction particularly in the lower temperature ranges. While the reaction is normally carried out in air, oxygen-rich atmospheres may be used. Reducing atmospheres should be avoided to insure complete oxidation of lead and bismuth.

The new compositions all show the onset of superconductivity at temperatures above the boiling point of liquid helium, 4.2K. and some at temperatures as high as about 13K. The temperature marking the onset of superconductivity, $T_c$, is indicated by conventional criteria, e.g., the sudden loss of usual electrical resistivity, and the sudden change in magnetic susceptibility (Meissner Effect). Electrical measurements show an apparently complete loss of resistivity at a single temperature, $T_c$. The change in magnetic susceptibility, initiated at about the same upper temperature as the loss in resistivity, extends over a range of temperatures and may not be completed above 4K. Electrical measurements however are less precise and their sharp change may merely reflect a first superconductive path, shorting out the specimen rather than a homogeneous change in state. Accordingly, the change in susceptibility measured by the Meissner Effect and described below is regarded as the more meaningful criterion of superconduction.

The Meissner Effect procedure employed here for characterizing superconductive behavior is described below. The finely-ground powdered product is packed into small capillary tubes (melting point tubes of 1 mm bore) to a constant depth (5.00 mm measured by low power microscope). The filled tube forms the core of a close-fitting coil in which the magnetic susceptibility can be measured in a constant magnetic field (1 Oersted in these measurements). The susceptibility is indicated by a voltage signal as a function of temperature in a surrounding helium cryostat.

As the temperature is lowered the voltage signal, otherwise quite constant, suddenly begins to rise at the superconducting transition temperature as the magnetic flux is expelled from the superconducting portions of the core into the surrounding coil. The voltage signal levels off at a higher level when all material capable of transforming to a superconductive state has done so. The total change in susceptibility (e.g., the percentage change in voltage signal) is a relative indication of the amount of superconducting phase. The homogeneity of the superconducting composition is indicated by the sharpness ($\Delta T$) of the transition.

The low field used in the tests employed here gives an essentially zero-field transition temperature. Little hysteresis was observed (generally no more than a tenth of a degree) upon cycling thru the transition temperature. This temperature corresponds well with the temperature observed from resistivity measurement as the onset of superconductivity.

The transition temperatures observed for these new compositions are surprisingly high but are not always sharp. In a number of the examples below, the permeability was still changing at the lowest temperature available in the apparatus (4.2K) indicating that transformation was not yet complete. It is possible that the surprising effect of variations in composition (critical limit of $x$ and $y$) is manifested on a microscopic scale in slightly non-homogeneous powders which show a range of critical temperatures. The sharpness of the transition is affected by thermal history of the product. For particular needs, heat treatments may be adapted for specific compositions to increase the sharpness of the transition.

EXAMPLES OF THE INVENTION

The following examples, illustrating the novel products of this invention and the method of their preparation, are given without any intention that the invention be limited thereto.

EXAMPLE 1

$BaPb_{0.75}Bi_{0.25}O_3$ 1.2425g. $Ba(NO_3)_2$, 1.1809g. $Pb(NO_3)_2$ and 0.5765g. $Bi(NO_3)_3 \cdot 5H_2O$ were mixed by grinding in a mortar. These reactants were heated in air for about 10 hours at 800°C with regrinding after several minutes at 800°C. A black powder was obtained which gave an x-ray diffraction pattern characteristic of the perovskite structure.

This sample was reground, pelletted, and heated at 900°C in air for about 10 hrs. The electrical resistivity of this pellet measured by a four-probe method was found to be 0.15 ohm cm at 298K. The activation energy of resistivity was 0.03 eV just below room temperature. As the temperature was lowered the activation energy decreased, and the sample resistance suddenly became very small below about 11K. indicating superconductive behavior.

EXAMPLES 2–12

Other examples of the invention are shown in Table 1. The preparations were made from the indicated starting materials in the manner of Example 1. A single heating cycle of 10 hours at 900°C was used in all cases except Examples 6 and 10, where a 10 hr. cycle at 800°C was used. Each of the preparations exhibited a perovskite-type diffraction pattern. Examples 6–12 illustrate the substitution of elements A for a portion of the barium.

TABLE I

| Example | g.$Ba(NO_3)_2$ | g.$Pb(NO_3)_2$ | g.$Bi(NO_3)_3$-5$H_2O$ | g. other | x | y | $T_c$* |
|---|---|---|---|---|---|---|---|
| 2 | 1.3062 | 1.5726 | 0.1212 | — | 0 | 0.05 | 9 |
| 3 | 1.2897 | 1.4709 | 0.2394 | — | 0 | 0.10 | 10.5 |
| 4 | 1.2579 | 1.2752 | 0.4669 | — | 0 | 0.20 | 11 |
| 5 | 1.2276 | 1.0889 | 0.6835 | — | 0 | 0.30 | 12.5 |
| 6 | 1.1534 | 1.2181 | 0.5946 | 0.0339 $K_2CO_3$ | 0.1 | 0.25 | 12.5 |
| 7 | 1.1360 | 1.1997 | 0.5857 | 0.0787 $Cs_2CO_3$ | 0.1 | 0.25 | 11.5 |
| 8 | 1.1391 | 1.1277 | 0.7047 | 0.0335 $K_2CO_3$ | 0.1 | 0.30 | 11 |
| 9 | 1.0449 | 1.1587 | 0.7273 | 0.0691 $K_2CO_3$ | 0.2 | 0.30 | 12 |
| 10 | 1.1306 | 1.1144 | 0.6995 | 0.0555 $Rb_2CO_3$ | 0.1 | 0.30 | 12 |
| 11 | 1.1421 | 1.1257 | 0.7066 | 0.0257 $Na_2CO_3$ | 0.1 | 0.30 | 12 |
| 12 | 1.1135 | 1.0975 | 0.6889 | 0.1002 $Sr(NO_3)_2$ | 0.1 | 0.30 | 10.5 |

*Onset of Meissner Effect, K.

Although the invention has been described and exemplified by way of specific embodiments, it is not intended that it be limited thereto. As will be apparent to those skilled in the art, numerous modifications and variations of these embodiments can be made without departing from the spirit of the invention or the scope of the following claims.

I claim:

1. Compositions of the formula $Ba_{1-x}A_xPb_{1-y}Bi_yO_3$ where
   A is Na, K, Rb, Cs, Sr or Pb,
   $x$ is 0 to 0.5,
   $y$ is 0.05–0.3 with the proviso that $x$ is equal to or less than $y$ when A is Na, K, Rb or Cs.

2. The compositions of claim 1 which have a perovskite-type crystalline structure.

3. The compositions of claim 2 which are superconductors with transition temperatures above 4.2K.

4. The compositions of claim 3 in which $x$ is 0.

5. The compositions of claim 4 in which $y$ is 0.2–0.3.

* * * * *